United States Patent
Sakamoto

[11] 4,119,259
[45] Oct. 10, 1978

[54] AUTOMATIC BONDING APPARATUS FOR ASSEMBLING SEMICONDUCTOR DEVICES

[75] Inventor: Yuzaburo Sakamoto, Takasaki, Japan

[73] Assignee: Hitachi, Ltd., Japan

[21] Appl. No.: 379,972

[22] Filed: Jul. 17, 1973

[30] Foreign Application Priority Data

Jul. 26, 1972 [JP] Japan .................................. 47-74183

[51] Int. Cl.$^2$ ............................................ H01L 21/60
[52] U.S. Cl. ........................................ 228/4.5; 228/45
[58] Field of Search .................... 156/580; 228/1, 3, 4, 228/5, 6, 4.1, 4.5, 904, 3.1, 1 R, 6 A, 45; 74/54, 55; 29/203 B, 203 D, 203 MW, 739

[56] References Cited
U.S. PATENT DOCUMENTS

| | | | |
|---|---|---|---|
| 3,110,425 | 11/1963 | Fuller | 74/55 X |
| 3,342,395 | 9/1967 | Diepeneen | 228/1 |
| 3,653,268 | 4/1972 | Diepeneen | 74/55 |
| 3,773,240 | 11/1973 | Heim | 228/4 |
| 3,813,022 | 5/1974 | Radobenko | 228/3 |

*Primary Examiner*—Francis S. Husar
*Assistant Examiner*—Gus T. Hampilos
*Attorney, Agent, or Firm*—Craig & Antonelli

[57] ABSTRACT

An automatic bonding apparatus for assembling semiconductor devices, said apparatus comprising a bonding arm carrying a capillary at one end and mounted on a pedestal swingably in a vertical plane, said pedestal being mounted on a base movably in a horizontal plane, horizontal driving cam means for driving said pedestal in the horizontal plane, vertical driving cam means for effecting swinging movement of said bonding arm, and synchronizing mechanism for determining the speed ratio of said horizontal driving cam means to said vertical driving cam means.

6 Claims, 11 Drawing Figures

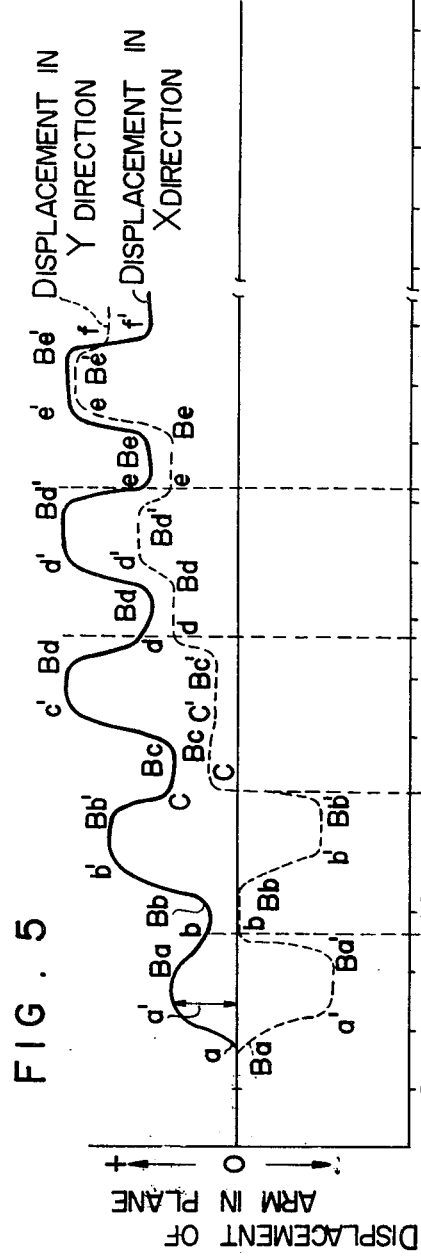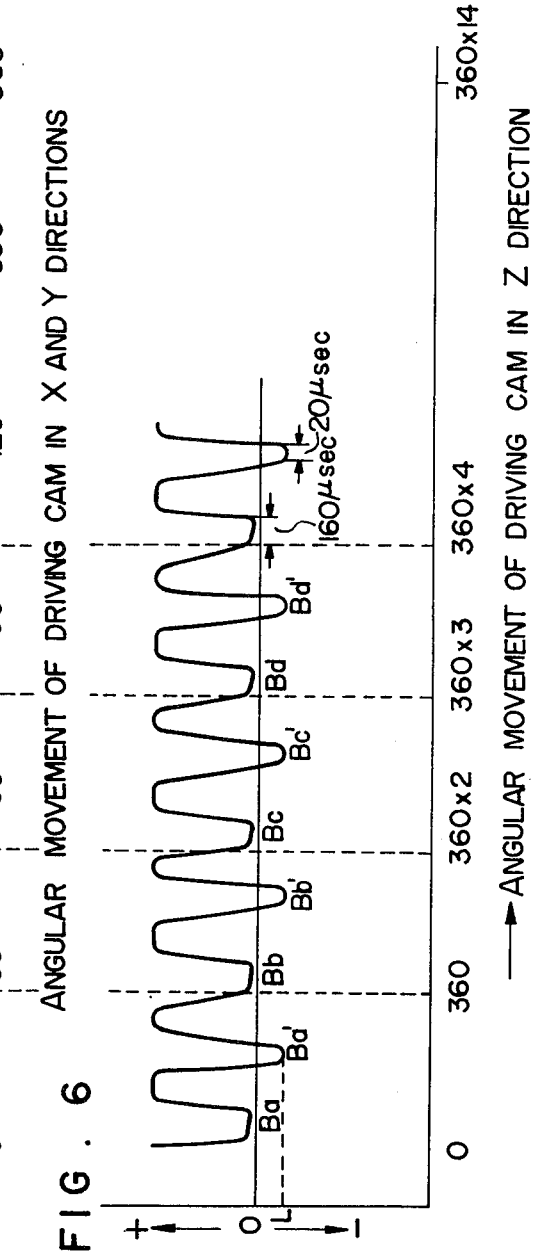
FIG. 5
FIG. 6

AUTOMATIC BONDING APPARATUS FOR ASSEMBLING SEMICONDUCTOR DEVICES

The present invention relates to an automatic bonding apparatus for use in assembling appliances including semiconductors. More particularly, the present invention relates to an arm shifting mechanism for such an automatic bonding apparatus.

In manufacturing a transistor or a semiconductor integrated circuit, it is a very important process to make connections between electrodes of the semiconductor element and external leads. For this purpose, a bonding apparatus is commonly used.

A conventional bonding apparatus generally includes a shifting mechanism for securing semiconductor assembly including semiconductor elements to a predetermined position and applying heat to the assembly, a bonding section primarily comprising a capillary for picking a connecting wire up and bonding it through a thermal compression process, and a manipulator mechanism for moving horizontally and/or vertically with respect to electrodes of the semiconductor elements or lead wires. An operator visually detects through a microscope the relative position of the capillary with respect to a portion where bonding is to be made, and manually operates the manipulator to shift the capillary to a position desired for bonding.

The conventional manual bonding operation requires skill and labour and there has been serious problems in that rate of production is reduced due to fatigue of operators and incomplete connections have often been produced. Thus, there is a need for an automatic bonding apparatus.

For this purpose, a digitally controlled automatic bonding apparatus has been proposed. This apparatus includes a small computer for memorizing movements of the capillary and controlling movements of a bonding arm. Thus, the apparatus further includes pulse motors for controlling the movements of the bonding arm in the X or transverse direction, in the Y or longitudinal direction and in the Z or vertical direction, an image tube for detecting the relative position of the capillary with respect to a semiconductor element, whereby the computer is operated in accordance with the detected value to calculate a deviation of the capillary. The pulse motors are then actuated to eliminate the deviation.

The inventors have actually built a digitally controlled automatic bonding apparatus which includes pulse motors for driving a capillary carrying arm in accordance with input pulses. However, the inventors have found that the automatic bonding apparatus of this type is disadvantageous in that it is very expensive because it uses very expensive parts, that it is not reliable in operation and has problem in maintenance, that it cannot attain a higher operating speed and impossible to make fine adjustments, and that it is very difficult to make a control of the path and speed of the movement of the capillary carrying arm. In a pulse motor, it is difficult to start the motor with a relatively higher pulse rate, such as 1000 PPS (pulse per second), it is necessary to decrease the pulse rate as low as 500 PPS during starting period of the motor and then increase the pulse rate during operation.

Therefore, an object of the present invention is to provide an automatic bonding apparatus which can be manufactured with a lower cost.

Another object of the present invention is to provide an automatic bonding apparatus which is reliable in operation, ready for maintenance and can be operated with a higher speed.

A further object of the present invention is to provide an automatic bonding apparatus which can operate with a higher efficiency and with a higher rate of yield, and produce reliable products.

According to the present invention, the above objects can be achieved by a bonding apparatus comprising a bonding arm and means for shifting the arm in longitudinal, transverse and vertical directions, characterized by the fact that said shifting means comprises horizontal drive cams mounted on a common shaft for shifting said arm in the longitudinal and transverse directions, respectively, a vertical drive cam mounted on a second shaft for vertically shifting an end of said arm, and a mechanism for synchronizing the rotation of the first shaft carrying the horizontal drive cams with the rotation of the second shaft carrying the vertical drive cam, so that the first and second shafts are rotated with a predetermined speed ratio.

The above and other objects and features of the present invention will become apparent from the following descriptions of a preferred embodiment taking reference to the accompanying drawings, in which.

FIGS. 4a through 4f diagramatically show the sequence of bonding operation in accordance with the present invention; and FIGS. 5 and 6 are timing diagrams in the operation of the apparatus in accordance with the present invention.

Figure 1:
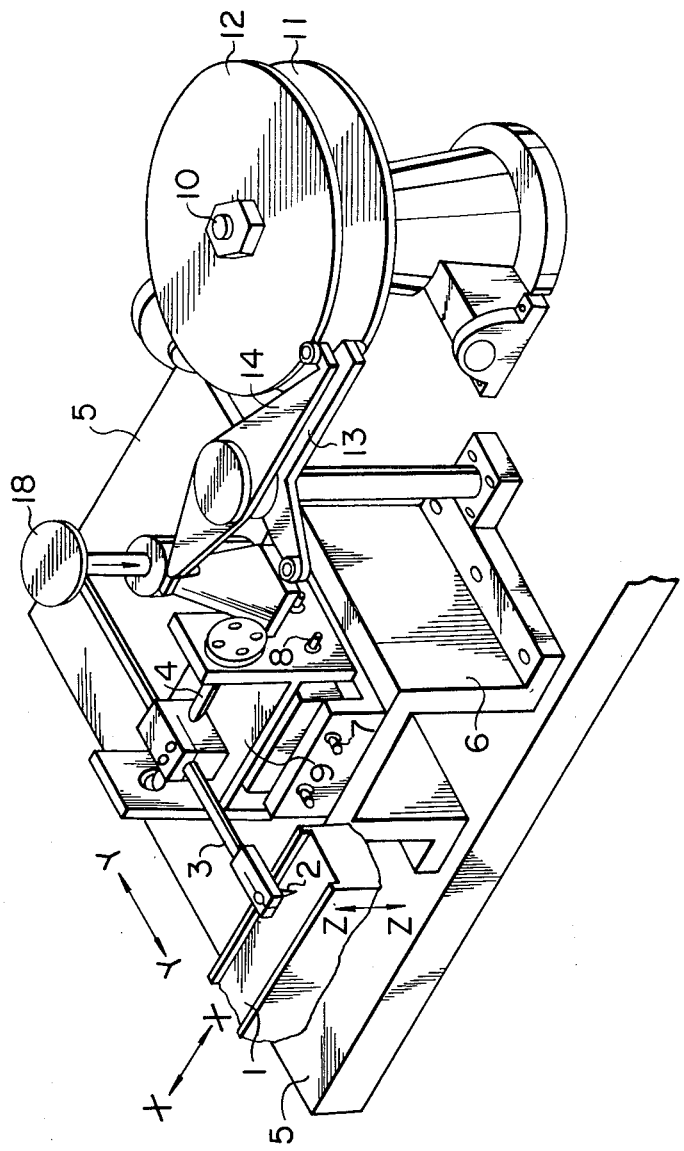
FIGS. 1 and 2 show in perspective views an automatic bonding apparatus in accordance with the present invention.

Referring to the drawings, particularly to FIG. 1, it is assumed that a guide rail (1) extends in X-direction or longitudinal direction, and the term Y-direction or transverse direction is used to indicate the direction horizontal and perpendicular to the X-direction while the term Z-direction indicates a vertical direction. The illustrated bonding apparatus includes a capillary 2 which is mounted on one end of a bonding 3 extending perpendicularly to the guide rail 1 or in the Y-direction. The arm 3 is supported at its intermediate portion by a longitudinally extending shaft 4. The arm 4 is rotatably mounted on an arm pedestal 9 so that the end of the bonding arm 3 carrying the capillary 2 can be vertically shifted in accordance with the rotation of the shaft 4. As shown in FIG. 1, the pedestal 9 carrying the arm shaft 4 is slidably mounted through transverse and longitudinal guide rods 7 and 8 respectively, on a support frame 6 which is in turn secured to a base 5.

On the base 5, there is also mounted a longitudinally driving cam 11 and a transverse driving cam 12 which are co-axially mounted on a vertical shaft 10 suitably supported by bearing means. The cams 11 and 12 respectively co-operate with cam followers 13 and 14 for driving the pedestal 9 in the longitudinal and transverse directions, respectively.

Figure 2:
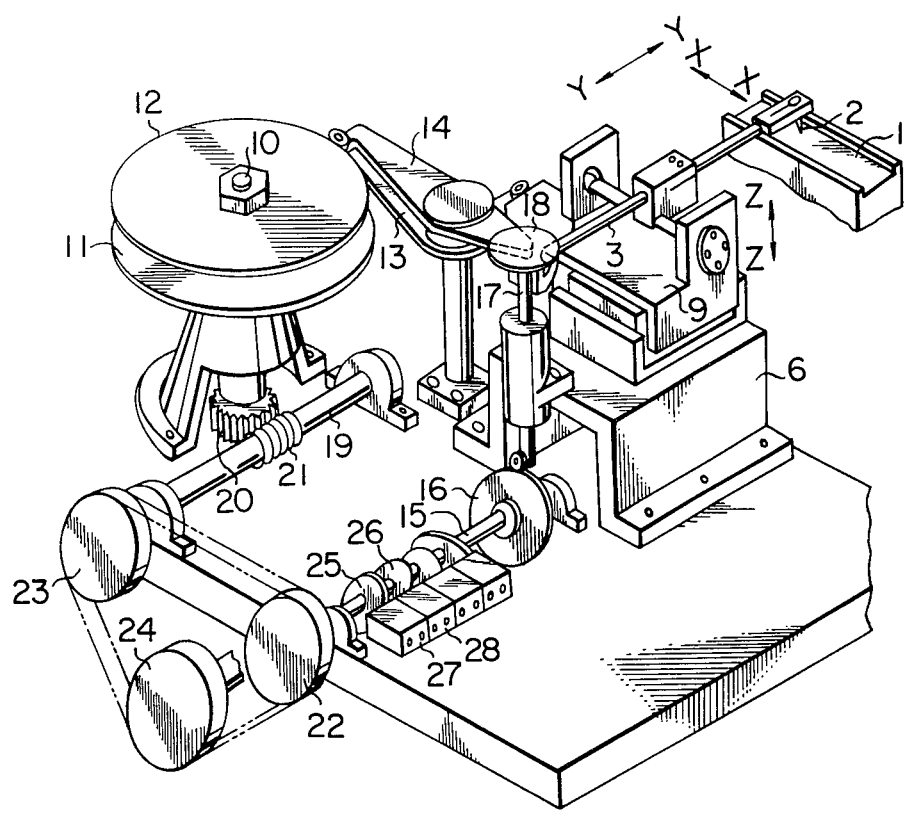
Figure 3:
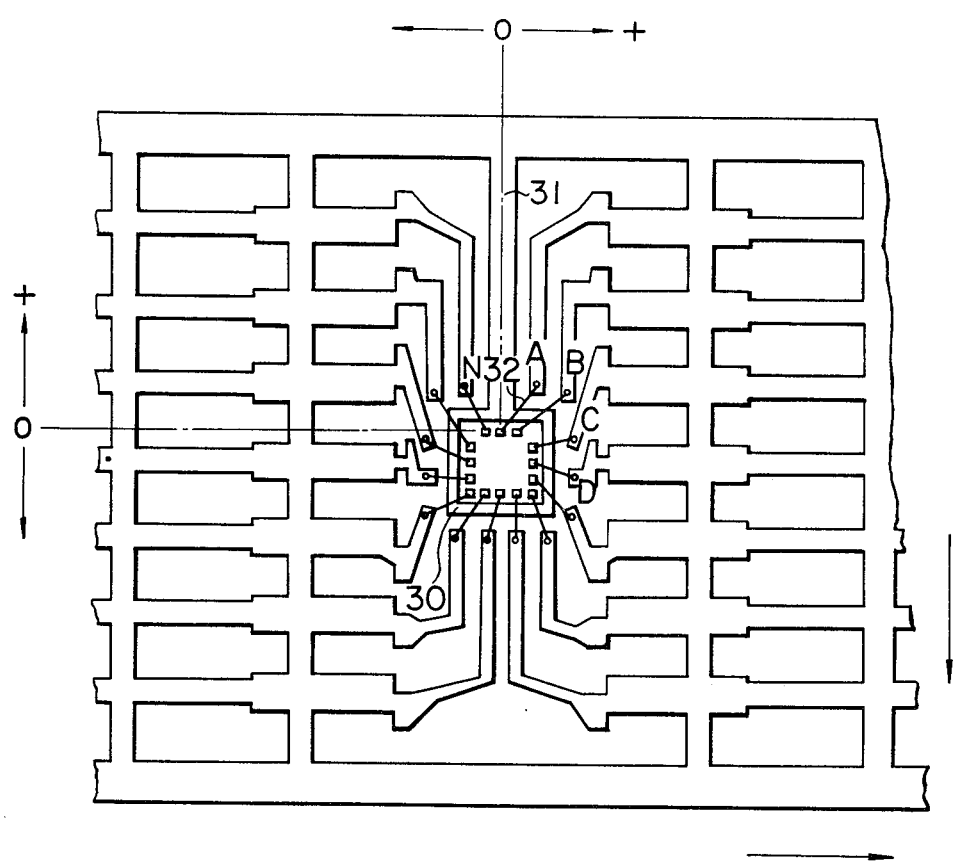
FIG. 3 is a plan view of a semiconductor integrated circuit which can be bonded by the automatic bonding apparatus of the present invention.

As shown in FIG. 2, the base 5 further carries a horizontally extending rotatable shaft 15 to which a vertical driving cam 16 is secured. The cam 16 co-operates with a cam follower at the lower end of a vertically slidable rod 17. The rod 17 carries at its upper end a disc 18 which engages at its lower surface the free end of the bonding arm 3 so as to control the level of the capillary 2 carried on the other end of the bonding arm 3.

A horizontally extending shaft 19 is rotatably mounted on the base 5 and connected through a worm wheel 20 and a worm 21 with the vertical shaft 10 carrying the horizontal drive cams 11 and 12, so that the shaft 10 is rotated by the shaft 19 with a suitable speed ratio, for example, 1:14. The horizontal shaft 19 is also connected through a belt-pulley mechanism including pulleys 22, 23 and 24. The pulley 24 is secured to a drive shaft from which driving force is transmitted through the pulleys 22 and 23 to the horizontal shafts 15 and 19.

The horizontal shaft 15 carrying the vertical drive cam has also switch drive cams 25, 26 . . . which are adapted to actuate micro switches 27, 28 . . . for controlling discharge of hydrogen for performing bonding operation. The aforementioned cam followers and/or the cam follower rod are combined with spring bias means so that the cam followers are brought into smooth contact with the co-operating cams. Spring bias means is also provided between the pedestal 9 and the guide rods so that the pedestal 9 is urged to the cam followers.

The operation of the automatic bonding apparatus in accordance with the present invention will now be described. The apparatus may be used in assembling a semiconductor pellet 30 having for example 14 electrodes a, b, c . . . n on a lead frame 31 having corresponding number of leads A, B, C . . . N by connecting each of the electrodes to the corresponding one of the leads through a connecting wire, so as to form a semiconductor integrated circuit.

Figure 4A:
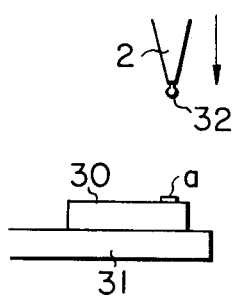
Figure 4B:
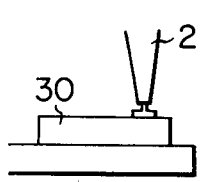
Figure 4C:
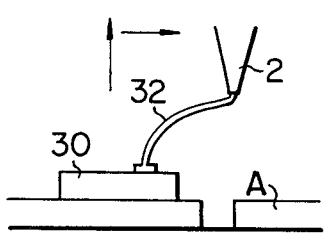
Figure 4D:
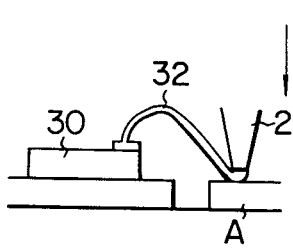
Figure 4E:
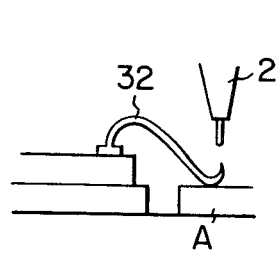
Figure 4F:
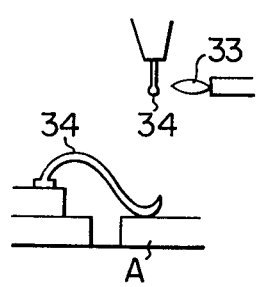

In bonding operation, as shown in FIGS. 4a through 4f, the capillary 2 is placed above the electrode a to which the pellet 30 is connected, FIG. 4a, and then it is moved downwardly in the Z-direction until the capillary 2 depresses by its tip end the connector wire 32 so that the wire is bonded at its one end to the pellet 30 through heat sealing operation under pressure, FIG. 4b. Thereafter, the capillary 2 is lifted vertically upwardly and at the same time shifted in the horizontal direction to a position above the lead A, FIG. 4c. Then, the capillary 2 is again lowered to make connection between the other end of the connector wire 32 and the lead A, FIG. 4d. After the bonding operation, the capillary 2 is lifted with the connector wire clamped thereto so that the wire is cut as the capillary 2 is lifted, FIG. 4e. Finally, the wire at the tip end of the capillary is molten by hydrogen flame 33 to form a bead 34 at the tip end of the wire, FIG. 4f. The capillary 2 is then shifted in the horizontal direction to a position above the electrode to be connected and the bonding operation is repeated.

The aforementioned movement of the capillary 2 is performed by the operation of the driving cams which produce horizontal and vertical movement of the bonding arms.

FIG. 5 shows a plane displacement of the bonding arm with respect to angular movements of the horizontal driving cams, and the solid line designates the longitudinal displacement while the broken line designates the transverse displacement. FIG. 6 designates the vertical displacement of the capillary with respect to the angular movement of the vertical driving cam. In the drawing, the point O on the ordinate designates the level of the pellet surface and L designates the lead surface. In the drawing, it should be noted that the displacement of the cam follower rod 17 is opposite in direction to the displacement of the capillary 2. According to the present invention, the horizontal displacement in the X and Y directions is synchronized with the vertical displacement, and each of the horizontal driving cams is rotated by 1/14 of a full turn (25.7°) as the vertical driving cam is rotated by a full turn or 360°. Thus, it should be noted that the vertical driving cam is rotated by 360° during two bonding operations, that is, the bonding operation at the electrode of the semiconductor element and the bonding operation at the lead, so that the vertical driving cam is rotated by 14 turns for completing the bonding at all of the electrodes on the pellet.

It should of course be noted that the bonding apparatus of the present invention is also applicable to bonding operation of a semiconductor integrated circuit having different number of electrodes, different positions of electrodes and different configuration of leads merely by changing the shapes of the driving cams. The speed reduction gear mechanism 20 and 21 for determining the speed ratio between the horizontal driving cams and the vertical driving cam may be substituted by a belt-pulley mechanism including a timing belt.

According to the present invention, bonding operation is automatically performed by cam driving means so that the work can be efficiently accomplished as compared with prior manual bonding operation. Further, the present invention is advantageous over a conventional digitally controlled automatic bonding apparatus in that the adjustment of moving path and speed of the capillary can be readily made. For example referring to wire bonding time, a wire can be bonded in about 0.5 second in an apparatus embodying the present invention, while it takes about 1.2 second in a manual operation and 0.8 second in a digitally controlled apparatus. Thus, the rate of operation can be remarkably increased.

According to the present invention, the apparatus can be operated without requiring any skill of operator and bonding operation can be performed with a higher accuracy. In an apparatus embodying the present invention, the rate of defective products can be decreased as low as 0.1 to 0.2% while, in a manual operation, the rate is about 1 to 2%.

The apparatus of the present invention is very simple in construction as compared with the conventional digitally controlled apparatus since the former uses simple cam mechanisms, so that the apparatus can be operated with less trouble. Further, the apparatus can be manufactured with substantially lower cost as compared with the digitally controlled apparatus. Thus, it is possible to reduce the cost for bonding operation.

Further, it should be noted that the apparatus of the present invention can be used in integrated circuits of various shapes and dimensions simply by changing the cam shapes and speed ratio of the horizontal driving cam and the vertical driving cam. The invention can thus be applied to every types of automatic bonding apparatus for assembling semiconductor means.

The invention has thus been shown and described with reference to a specific embodiment which is believed to be preferable, however, it should be noted that the invention shall in no way be limited to the details of the illustrated structures but it should be construed that the scope of the invention is limited only by the appended claims.

I claim:

1. A bonding apparatus comprising a bonding arm and means for shifting the arm in longitudinal, transverse and vertical directions, wherein said shifting means comprises horizontal drive cams mounted on a common shaft for shifting said arm in the longitudinal and transverse directions, respectively, a vertical drive cam mounted on a second shaft for vertically shifting an end of said arm, and a mechanism for synchronizing the rotation of the first shaft carrying the horizontal drive cams with the rotation of the second shaft carrying the vertical drive cam, so that the first and second shafts are rotated with a predetermined speed ratio.

2. A bonding apparatus comprising a bonding arm carrying a capillary at one end and means for shifting the capillary in longitudinal, transverse and vertical directions, wherein said arm is mounted on a pedestal swingably movable in a vertical plane, said pedestal being mounted on a base so that said pedestal is movable in the longitudinal and transverse directions, and wherein said shifting means comprises a first shaft carrying a longitudinal driving cam and a transverse driving cam, and a second shaft carrying a vertical driving cam, said longitudinal and transverse driving cams engaging said pedestal to drive said pedestal in the longitudinal and transverse directions respectively, said vertical driving cam engaging said bonding arm to effect swinging movement thereof so that the capillary carried thereon is vertically shifted, said apparatus further comprising a mechanism for synchronizing the rotation of the first and the second shafts so that they are rotated with a predetermined speed ratio.

3. A bonding apparatus comprising:
a bonding arm;
pedestal means connected to said bonding arm and adapted to move said bonding arm in the longitudinal, transverse and vertical directions into and out of association with an article to be bonded;
horizontal driving cam means engaging said pedestal and controlling the longitudinal and transverse movement of said bonding arm; and
vertical driving cam means engaging said pedestal and controlling the vertical movement of said bonding arm, said vertical driving cam means including a vertical rotating cam and a vertically positioned cam follower engaging said vertically positioned cam, said horizontal and vertical driving cam means interconnected so that said horizontal and vertical driving cam means rotate with a predetermined speed ratio.

4. The apparatus of claim 1, wherein said horizontal driving cam means includes a horizontally positioned longitudinal cam, a horizontally positioned transverse cam and respective horizontally positioned longitudinal and transverse cam followers.

5. The apparatus of claim 4, wherein the longitudinal and transverse cams are mounted on a common shaft, and further wherein said apparatus includes synchronizing means for synchronizing the rotation of said common shaft and said second shaft.

6. The apparatus of claim 1, wherein said vertically positioned cam follower is mounted for vertical movement only, said vertically positioned cam follower including a vertically positioned rod and a disc attached at one end of said rod perpendicular to said rod, the surface of said disc facing said rod engaging said bonding arm.

* * * * *